(12) United States Patent
Tokita (10) Patent No.: US 7,224,434 B2
(45) Date of Patent: May 29, 2007

(54) EXPOSURE METHOD

(75) Inventor: Toshinobu Tokita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 11/252,440

(22) Filed: Oct. 17, 2005

(65) Prior Publication Data

US 2006/0082749 A1    Apr. 20, 2006

(30) Foreign Application Priority Data

Oct. 19, 2004   (JP)   ............... 2004-303900

(51) Int. Cl.
  *G03B 27/42*   (2006.01)
  *G03B 27/52*   (2006.01)
  *G03B 27/32*   (2006.01)
(52) U.S. Cl. ............... 355/53; 355/30; 355/77
(58) Field of Classification Search ........... 355/30, 355/53, 72, 77; 430/30
See application file for complete search history.

(56) References Cited

U.S. PATENT DOCUMENTS

2005/0037269 A1* 2/2005 Levinson ............... 430/30

2006/0126043 A1* 6/2006 Mizutani et al. ............... 355/53

FOREIGN PATENT DOCUMENTS

| JP | 6-124873 | * | 5/1994 |
| WO | 99/49504 | | 9/1999 |
| WO | WO 2004/053958 A1 | * | 6/2004 |

OTHER PUBLICATIONS

English Translation of WO 99/49504.*
English Translation of JP 6-124873.*
English Translation of WO 99/49504 (publication date Sep. 30, 1999).*
English Translation of JP 6-124873 (publication date May 1994).*
Bruce Smith, "Extreme-NA Water Immersion Lithography for 35-65 nm Technology", International Symposium on 157 nm Lithography, Sep. 3-6, 2002, Belgium.

* cited by examiner

*Primary Examiner*—Alan Matthews
(74) *Attorney, Agent, or Firm*—Morgan & Finnegan LLP (57) ABSTRACT

An exposure apparatus includes a projection optical system for projecting a pattern of a reticle onto an object to be exposed, via a liquid that is filled in a space between said projection optical system and the object, and a removing part for removing an air bubble and/or a foreign particle mixed in the liquid by forming a predetermined flow velocity distribution in the liquid.

2 Claims, 8 Drawing Sheets

EXPOSURE METHOD

BACKGROUND OF THE INVENTION

The present invention relates generally to an exposure apparatus and method, and more particularly to an exposure apparatus and method that exposes an object, such as a single crystal substrate of a semiconductor wafer and a glass plate for a liquid crystal display ("LCD"). The present invention is suitable for a so-called immersion exposure apparatus that fills a space with liquid between a final surface of a projection optical system and a surface of an object, and exposes the object via the liquid.

Conventionally, the photolithography technology has employed a reduction projection exposure apparatus using a projection optical system to project a circuit pattern of a reticle (mask) onto a wafer, etc., in manufacturing fine semiconductor devices such as a semiconductor memory and a logic circuit.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer processing to the semiconductor devices, a shorter wavelength of ultraviolet light has been promoted from a KrF excimer laser (with a wavelength of approximately 248 nm) to an ArF excimer laser (with a wavelength of approximately 193 nm). Currently, the next generation light sources are being developed, such as an $F_2$ laser (with a wavelength of approximately 157 nm) and extremely ultraviolet ("EUV") light.

With this background, the immersion exposure has attracted attentions as a method that uses the ArF laser for more improved resolution. The immersion exposure fills a space with the liquid between the final lens surface of the projection optical system and the image surface of the wafer (or arranges the liquid as a medium at a wafer side of the projection optical system). The immersion exposure shortens the effective wavelength of the exposure light, enlarges the apparent NA of the projection optical system, and improves the resolution.

In the immersion exposure, there are proposed two methods for filling liquid between the final lens surface of the projection optical system and the wafer. The first method puts the final lens surface of the projection optical system and the wafer under the liquid in a sink. The second method is a local fill method that flows liquid in a space between the projection optical system and the wafer and creates a liquid film. An exposure apparatus using this method is proposed. See, for example, "Bruce Smith, Exterme-NA Water Immersion Lithography for 35–65 nm Technology, International Symposium on 157 nm Lithography 3–6 Sep. 2002, Belgium" and International Publication No. WO99/49504.

Figure 8:
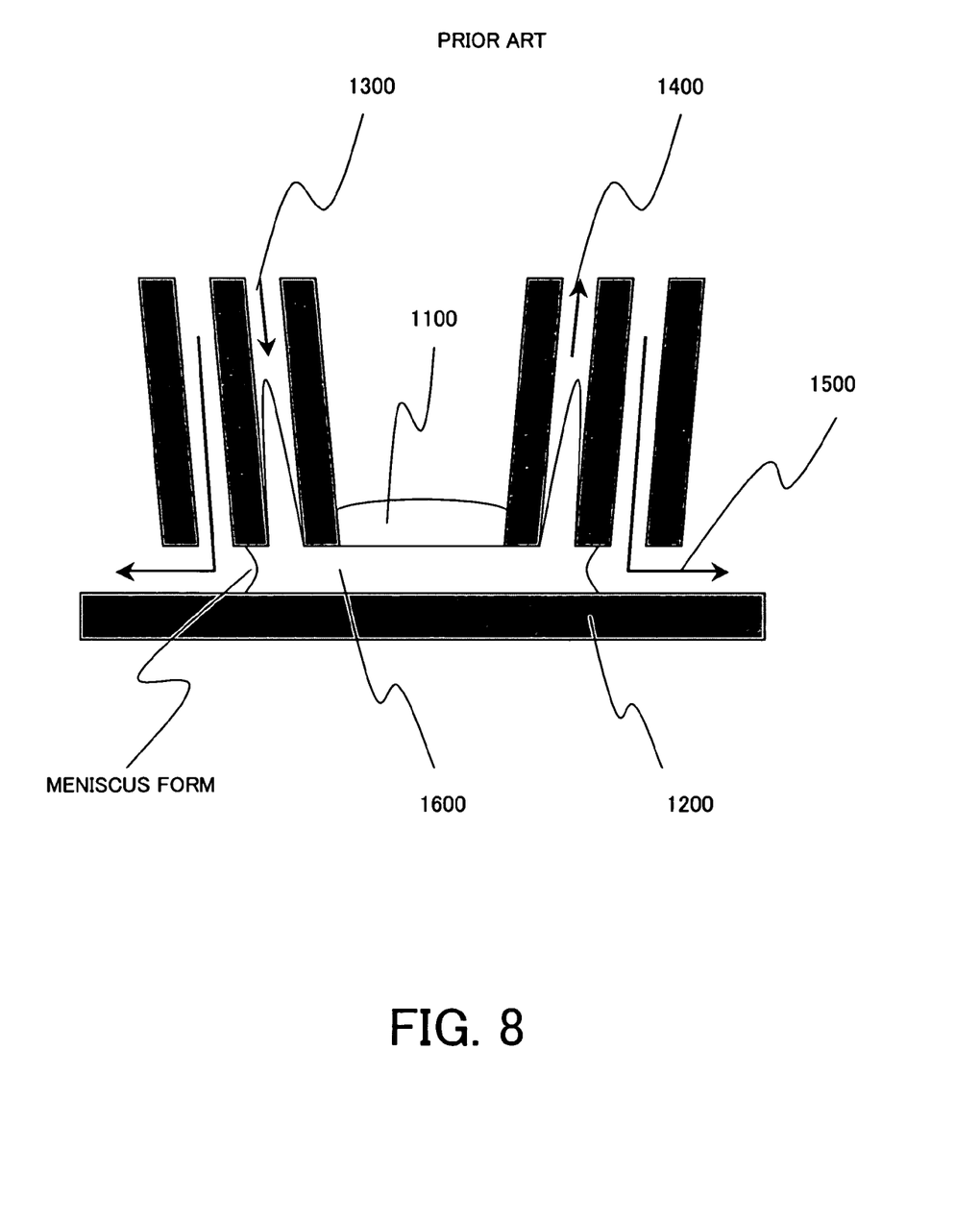
FIG. 8 is a schematic sectional view of principal part of a conventional immersion exposure apparatus.

FIG. 8 is a schematic sectional view of a conventional immersion exposure apparatus. Referring to FIG. 8, the conventional exposure apparatus supplies a liquid 1600 between opposing surfaces of a final lens surface 1100 and a wafer 1200 through a liquid supply nozzle 1300 installed near an edge part of the final lens surface 1100. Then, the conventional exposure apparatus recovers the liquid 1600 through a liquid recovery nozzle 1400 installed opposite to the final lens surface 1100. Moreover, an air curtain 1500 is formed by spraying compressed air from the outside of the liquid supply nozzle 1300 and the liquid recovery nozzle 1400, and maintains the liquid 1600 between the final lens surface 1100 and the wafer 1200.

International Publication No. WO99/49504 does not disclose the air curtain. However, the composition of the liquid supply nozzle and the liquid recovery nozzle is the same as FIG. 8. International Publication No. WO99/49504 has disclosed adjustments of a supply amount and recovery amount of the liquid according to a moving velocity of the water.

It is important for the immersion exposure to keep the liquid away from air bubbles, because they scatter the exposure light and deteriorates the imaging performance. The air bubbles are likely to occur, when a solid contacts a liquid surface (interface) and liquids contact each other. Therefore, continuous supplies of the liquid can reduce mixtures of the air bubbles.

However, at the time of the initial filling or when the liquid surfaces of the liquid supplied from the liquid supply nozzle are separated although the liquid exists between the final lens surface and the wafer, the liquid surfaces contact each other and the air bubbles likely to occur. This results in the reduced imaging performance due to the generated air bubbles, and the decreased productivity of semiconductor device manufacture. Moreover, the air bubbles are likely to mix the liquid in the structure shown in FIG. 8, because this structure sprays the compressed air to the liquid surface (meniscus surface) with which the air bubbles are likely to mix.

In International Publication No. WO99/49504, it is possible to keep the air bubbles hard away from the liquid by controlling flow rates of the supply and recovery of the liquid at the time of the initial filling. Where the liquid surface of the liquid supplied between the final lens surface and the wafer separates from that of the liquid supplied from the liquid supply nozzle are separated, the air bubbles are likely to occur when the continuously supplied liquids' surfaces contact each other. Therefore, the supply flow rate must be lowered. This configuration decreases the throughput of the exposure apparatus, and the productivity of semiconductor device manufacture.

BRIEF SUMMARY OF THE INVENTION

Accordingly, the present invention is directed to an exposure method, which keep the air bubbles from a liquid used to the immersion liquid, achieve a superior imaging performance, and maintain the productivity.

An exposure method includes exposing a pattern of a reticle onto an object to be exposed, via a liquid that is filled in a space between said projection optical system and the object, and removing an air bubble and/or a foreign particle mixed in the liquid by forming a predetermined flow velocity distribution in the liquid.

An exposure method according to another aspect of the present invention for exposing a pattern of a reticle onto an object supported by a stage via a projection optical system, said exposure method includes the steps of supplying a liquid to a space between said projection optical system and the object, and removing an air bubble and/or a foreign particle from the liquid supplied at the supplying step.

Other objects and further features of the present invention will become readily apparent from the following description of the preferred embodiments with reference to the accompanying drawings.

DETAILED DESCRIPTION OF THE PREFERRED EMBODIMENTS

Figure 1:
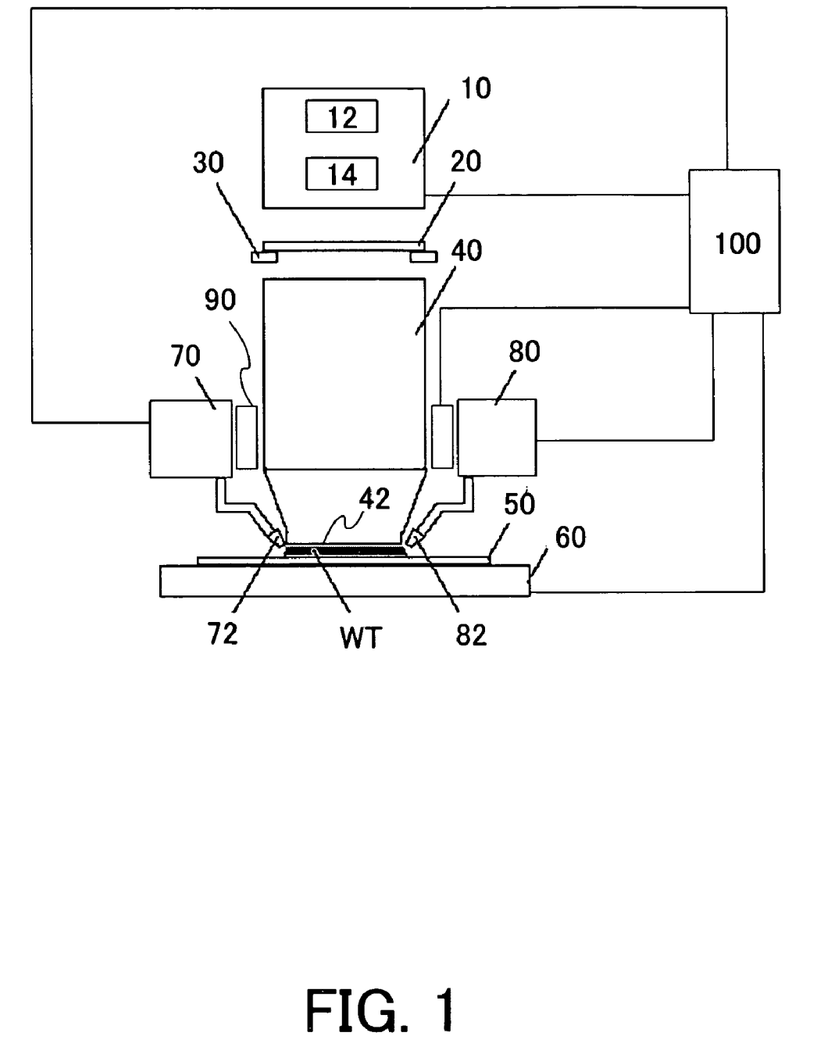
FIG. 1 is a schematic sectional view of an exposure apparatus as one aspect according to the present invention.

With reference to the accompanying drawings, a description will be given of an exposure apparatus 1 of one embodiment according to the present invention. In each figure, the same reference numeral denotes the same element. Therefore, duplicate descriptions will be omitted. FIG. 1 is a schematic sectional view of an exposure apparatus 1.

The exposure apparatus 1 is an immersion exposure apparatus that exposes onto an object 50 a circuit pattern of a reticle 20 via a liquid WT supplied between a final lens surface 42 at the object 50 side of a projection optical system 40. Such an exposure apparatus is suitable for a sub-micron or quarter-micron lithography process. The instant embodiment exemplarily describes a step-and-scan exposure apparatus (which is also called "scanner"). However, the present invention is applicable to step-and-repeat manner. "The step-and-scan manner," as is used herein, is an exposure method that exposes a reticle pattern onto a wafer by continuously scanning the wafer relative to the reticle, and by moving, after a shot of exposure, the wafer stepwise to the next exposure area to be shot. "The step-and-repeat manner" is another mode of exposure method that moves a wafer stepwise to an exposure area for the next shot every short of cell projection.

The exposure apparatus 1 includes, as shown in FIG. 1, an illumination apparatus 10, a reticle stage 30, a projection optical system 40, a wafer stage 60, a liquid supply part 70, a liquid recovery part 80, a detector 90, and a controller 100.

The illumination apparatus 10 illuminates the reticle 20, on which a circuit pattern to be transferred is formed, and includes a light source part 12 and an illumination optical system 14.

The light source part 12 uses, as an example, a light source such as ArF excimer laser with a wavelength of approximately 193 [nm] and KrF excimer laser with a wavelength of approximately 248 [nm]. Similarly, the number of light source is not limited. An optical system (not shown) arranged on an optical path for reducing speckles may swing linearly or rotationally. When the light source part 12 uses laser, it is desirable to employ a beam shaping optical system that shapes a parallel beam from a laser source to a desired beam shape, and an incoherently turning optical system that turns a coherent laser beam into an incoherent one. A light source applicable to the light source part 12 is not limited to a laser. One or more lamps, such as a mercury lamp and a xenon lamp, may be used.

The illumination optical system 14 is an optical system that illuminates the reticle 20, and includes a lens, a mirror, an optical integrator, a stop, and the like, for example, a condenser lens, an optical integrator, an aperture stop, a condenser lens, a slit, and an image-forming optical system in this order. The illumination optical system 14 can use any light regardless of whether it is axial or non-axial light. The optical integrator may include a fly-eye lens or an integrator formed by stacking two sets of cylindrical lens array plates (or lenticular lenses), and can be replaced with an optical rod or a diffractive element.

The reticle 20 is made, for example, of quartz, forms a circuit pattern to be transferred, and is supported and driven by the reticle stage 30. Diffracted light from the pattern of the reticle 20 passes through the projection optical system 40 and is then projected onto the object 50. The reticle 20 and the object 50 are located in an optically conjugate relationship. Since the exposure apparatus 1 is a scanner, the reticle 20 and the object 50 are scanned at the speed ratio of the reduction ratio of the projection optical system 40, thus transferring the pattern from the reticle 20 to the object 50. If it is a step-and-repeat exposure apparatus (referred to as a "stepper"), the reticle 20 and the object 50 remains still when exposing the reticle pattern.

The reticle stage 30 supports the reticle 20 via a reticle chuck (not shown), and is connected to a moving mechanism (not shown). The moving mechanism includes a linear motor, etc., and moves the reticle 20 by driving the reticle stage 30 in directions X, Y, Z, and a rotation direction of each axes. Here, X is a scan direction on the reticle 20 or the object 50, Y is a direction perpendicular to it, and Z is a perpendicular direction to the surface of reticle 20 or the object 50.

The projection optical system 40 images the diffracted light passing through the pattern of the reticle 20 onto the object 50. The projection optical system 40 may use an optical system comprising solely of a plurality of lens elements, an optical system including a plurality of lens elements and at least one concave mirror (a catadioptric optical system).

The object 50 is, in the instant embodiment, a wafer, which includes a glass plate for the liquid crystal substrate and other objects. Photoresist is applied to the object 50.

The wafer stage 60 supports the object 50 via a wafer chuck (not shown). The wafer stage 60 moves the object 50 in X-Y-Z directions by using a linear motor similar to the reticle stage 30. The positions of the reticle stage 30 and wafer stage 60 are monitored, for example, by a laser interferometer and the like, so that both are driven at a constant speed ratio. The wafer stage 60 is installed on a stage stool supported on the floor and the like, for example, via a dumper, and the reticle stage 30 and the projection optical system 40 are installed on a lens barrel stool (not shown) supported, for example, via a dumper to the base frame placed on the floor.

The liquid supply part 70 supplies the liquid WT to a space or interval between the projection optical system 40 and the object 50, and includes, for example, a refiner mechanism (not shown) and a liquid supply nozzle 72. In other words, the liquid supply part 70 supplies WT via the liquid supply nozzle 72 arranged around the final lens surface 42 of the projection optical system 40, and forms a liquid film in the space between the projection optical system 40 and the object 50. The space between the projection optical system 40 and the object 50 is preferably small enough to stably form and recovery the liquid film of the liquid WT, such as 0.5 mm or less. In the instant embodiment, the optical element closest to the object 50 side is called the final lens surface 42. However, the final lens surface 42 is not limited to the lens, and may be a plane-parallel plate glass (cover glass) etc. In this case, it is necessary to form the liquid film of the liquid WT between the plane-parallel plate glass and an optical element above it.

The liquid WT shortens an equivalent exposure wavelength of the exposure light from the light source part 12 and improves the exposure resolution. The liquid WT is pure water in the instant embodiment. However, the liquid WT is not limited to pure water. The liquid WT can use a liquid that has high transmittance property and refractive index property for a wavelength of the exposure light, and high chemical stability to the projection optical system 40 and the photoresist spread on the object 50. For example, fluorine system inert liquid may be used.

The refiner mechanism (not shown) reduces impurities, such as metal ions, fine particles and organic matters contained in a material water supplied from a material water supply source (not shown), and generates the liquid WT. The liquid WT refined by the refiner mechanism is supplied to the liquid supply nozzle 72. A deaerator and a temperature controller are installed to give a degassing processing to the liquid LW and to control the temperature of the liquid WT while the refiner mechanism supplies the liquid WT to the liquid supply nozzle 72.

The liquid supply nozzle 72 supplies the liquid WT refined by the refiner mechanism to the space between the projection optical system 40 and the object 50. The liquid supply nozzle 72 is made of a material that is unlikely to contaminate to liquid and has a good durability to the liquid WT. Such a material is, for example, a fluorine resin.

The liquid recovery part 80 recovers the liquid WT supplied between the final lens surface 42 of the projection optical system 40 and the object 50 via a liquid recovery nozzle 82. The liquid recovery part 80 includes, for example, the liquid recovery nozzle 82, a tank that temporarily stores the recovered liquid WT, and an aspirator that aspirates the liquid LW etc.

Figure 2:
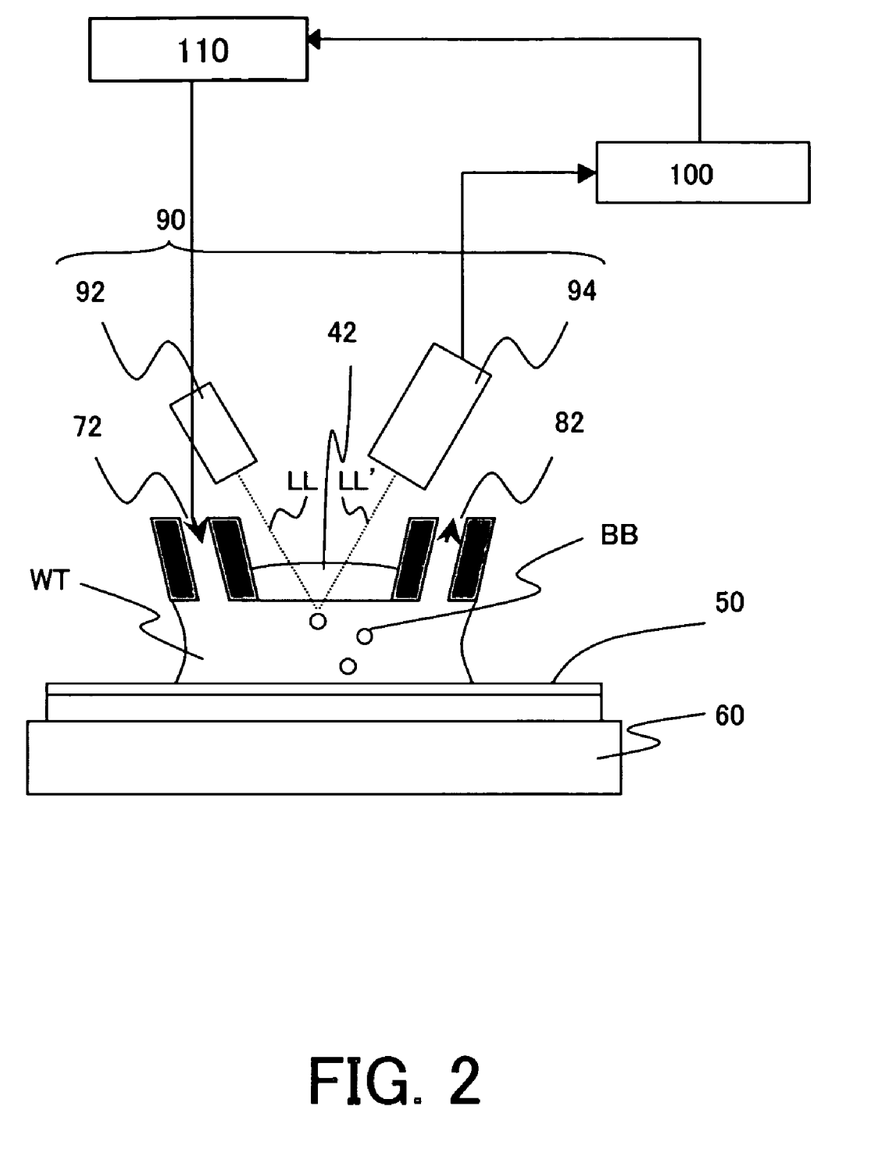
FIG. 2 is a schematic sectional view of a detector in the exposure apparatus shown in FIG. 1.

The liquid supply part 70 and the liquid recovery part 80 form a predetermined flow velocity distribution in the liquid WT by the supply amount and recovery amount of the liquid WT supplied between the final lens surface 42 of the projection optical system 40 and the object 50, and remove the air bubbles from the liquid LW. In other words, the liquid supply part 70 and the liquid recovery part 80 have a function of a removing part. A flow controller 110 that controls the supply amount and the recovery amount of the liquid WT is installed at an upstream side of the liquid supply nozzle 72 and a downstream side of the liquid recovery nozzle 82 as shown in FIG. 2. The predetermined flow velocity distribution may be formed in the liquid WT by the flow controller 110. For example, the controller 100 described later calculates the flow rate of the liquid WT supplied from the liquid supply nozzle 72, and the flow controller 110 controls supply amount of the liquid WT based on the calculated flow rate of the liquid WT. A position that arranges the flow controller 110 is not limited to the upper side of the liquid supply nozzle 72 (the downstream of the deaerator (not shown)), and may be the upstream of the deaerator (not shown) or the refiner part (not shown). The predetermined flow velocity distribution can be formed in the liquid WT by changing the interval between the final lens surface 42 of the projection optical system 40 and the object 50 or scanning the object 50. Therefore, the wafer stage 60 also constitutes a part of the removing part.

The detector 90 detects the air bubble BB mixed in the liquid WT. Moreover, the detector 90 detects a foreign particle mixed in the liquid WT. The detector 90 includes, in the instant embodiment, a projecting part 92 and a receiving part 94 as shown in FIG. 2. Here, FIG. 2 is a schematic sectional view of one example of the detector 90.

The projecting part 92 irradiates a light LL from a light source to the liquid WT. The light LL may originate from the light source part 12 (in other words, the exposure light) or a light from a light source of the detector 90 (in other words, the light other than the exposure light).

The receiving part 94 receives a light LL' irradiated from the projecting part 92 and diffused by the air bubble in the liquid WT. The receiving part 94 consists of a microscope for instance, and preferably has the resolution of almost 10 μm. The receiving part 94 can detect a position of the air bubble BB based on a focus position of the microscope. Moreover, the receiving part 94 can detect a position of the air bubble BB in a surface direction of the object 50.

The controller 100 includes a CPU and memory (not shown) and controls operation of the exposure apparatus 1. The controller 100 is electrically connected to the illumination apparatus 10, the reticle stage 30 (the moving mechanism of the reticle stage 30), wafer stage 60 (the moving mechanism of the wafer stage 60), the liquid supply part 70, the liquid recovery part 80 and the detector 90. The CPU includes a processor regardless of its name, such as an MPU, and controls each module. The memory includes a ROM and RAM, and stores a firmware for controlling the operations of the exposure apparatus 1.

The controller 100 controls, in the instant embodiment, the removing part based on the position of the air bubble BB mixed in the liquid WT detected by the detector 90. The controller 100 selects, for example, one removing method among plural removing methods stored in the memory according a position of the air bubble BB in the liquid WT in an optical axis direction as described later.

Figure 3A:
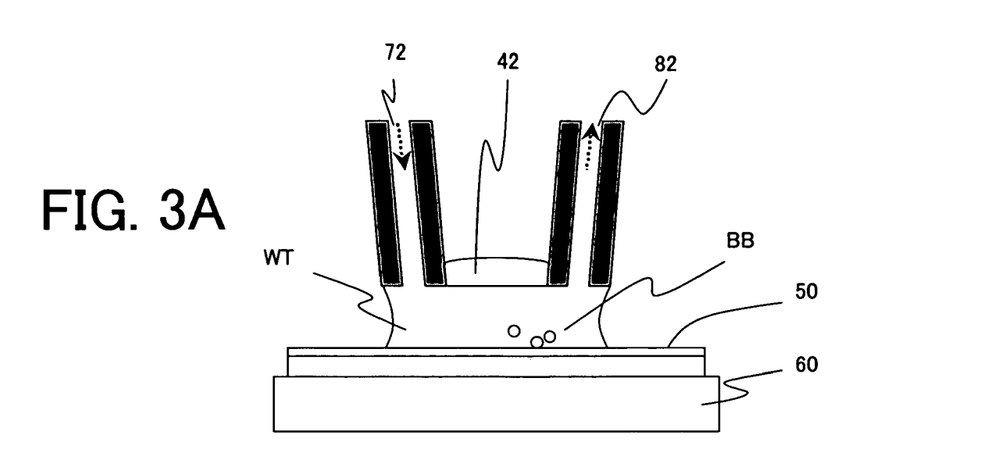
FIGS. 3A, 3B and 3C are views for explaining a removing method of air bubbles from a liquid in the exposure apparatus shown in FIG. 1.
Figure 3B:
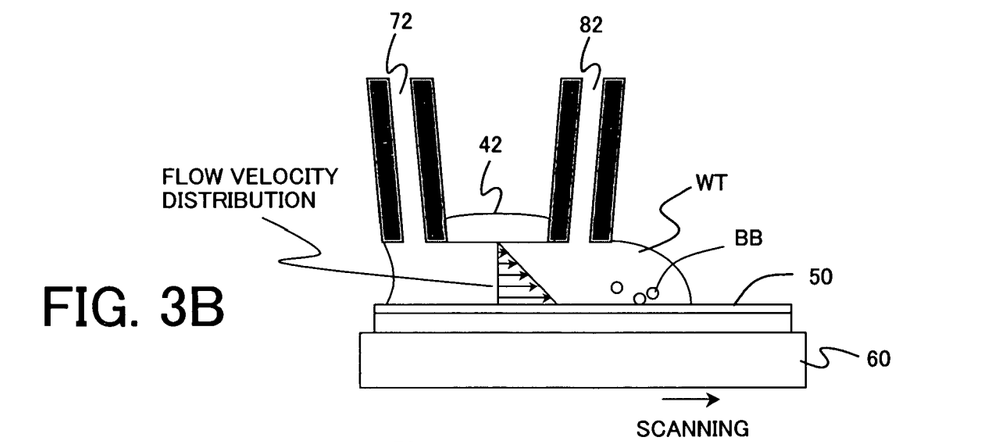
Figure 3C:
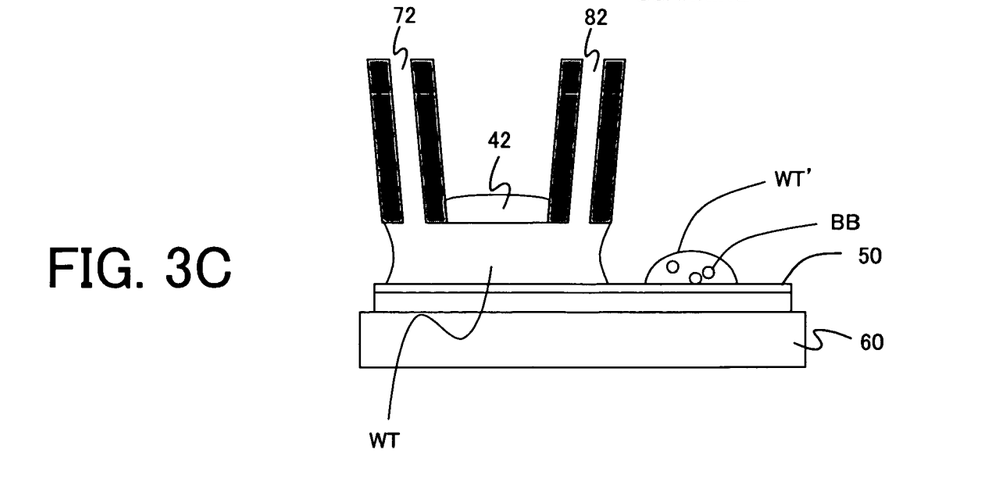
Figure 4A:
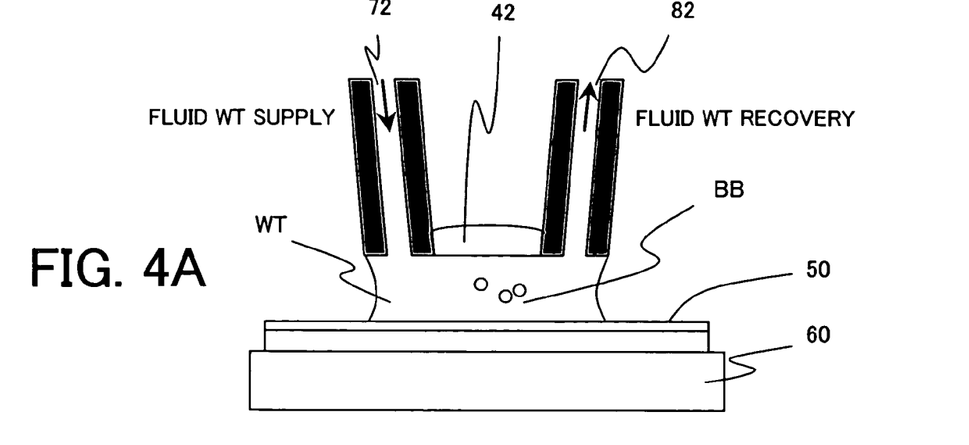
FIGS. 4A, 4B and 4C are views for explaining a removing method of air bubbles from a liquid in the exposure apparatus shown in FIG. 1.
Figure 4B:
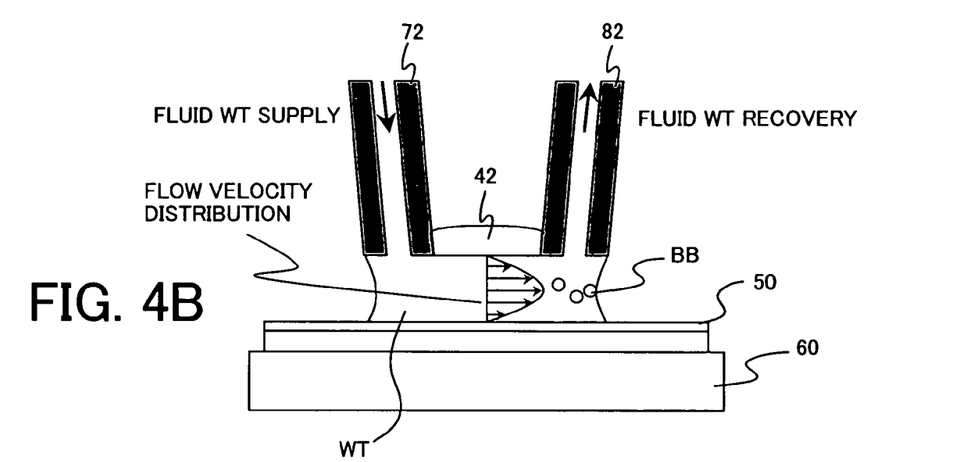
Figure 4C:
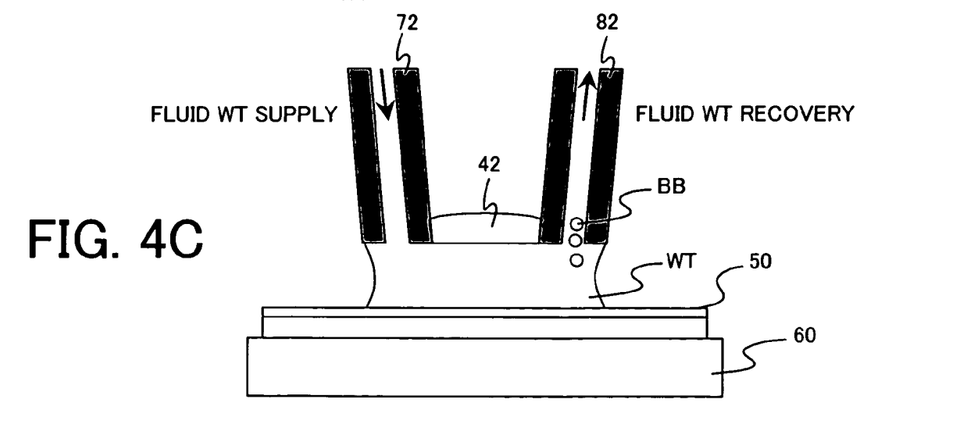
Figure 5A:
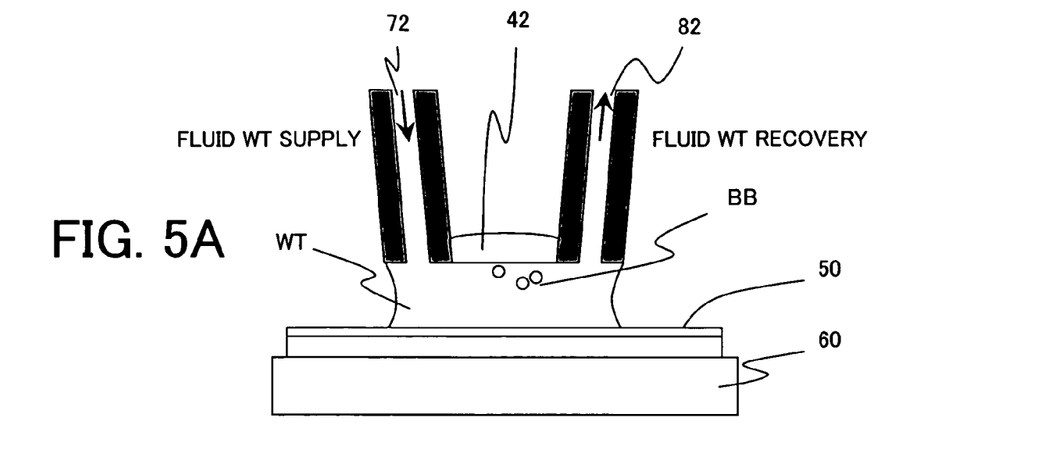
FIGS. 5A, 5B and 5C are views for explaining a removing method of air bubbles from a liquid in the exposure apparatus shown in FIG. 1.
Figure 5B:
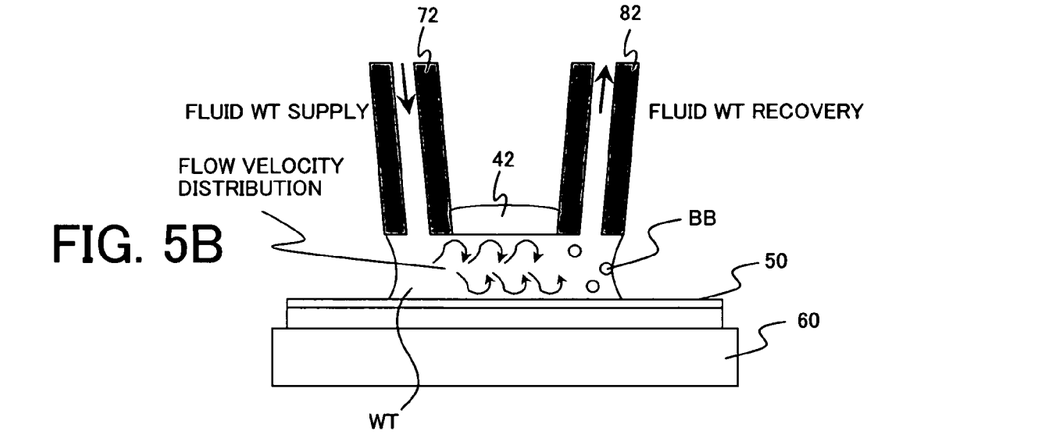
Figure 5C:
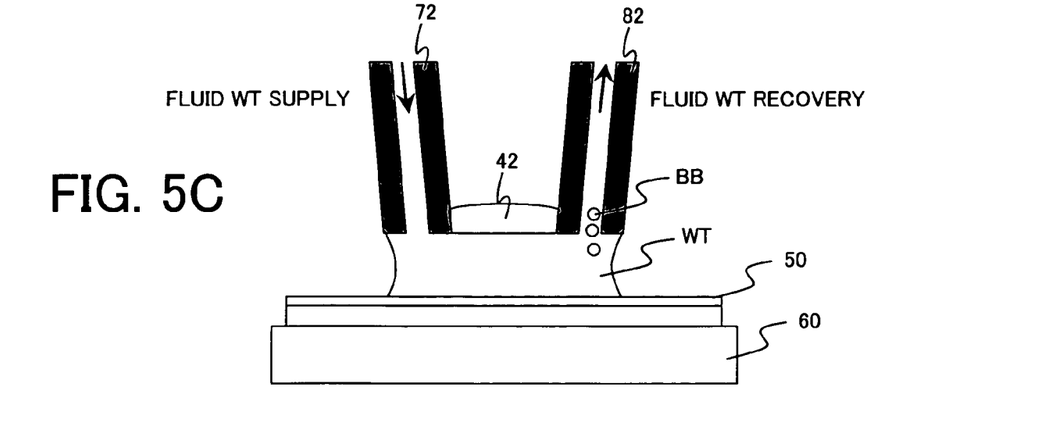

A description will be given of the removing method of the air bubble BB from the liquid WT by the controller 100. FIGS. 3 to 5 are views for explaining the removing method of the air bubble BB from the liquid WT in the exposure apparatus 1.

In the structure of the above exposure apparatus 1, the air bubble BB mixes a near position from the object 50 in the liquid WT as shown in FIG. 3A. The wafer stage 60 is scanned (driven) in a surface direction of the object 50 as shown FIG. 3B to remove the air bubble BB. Thereby, the flow velocity of the liquid WT at the object 50 side becomes almost 0, and the flow velocity distribution shown in FIG. 3B is formed because the flow velocity of the liquid WT at the object 50 side becomes almost same as a scanning velocity. Therefore, even if the air bubble BB mixes in the position near the object 50 of the liquid WT, the air bubble BB is removable from a position in which the imaging performance is reduce (in other words, an imaging area) by only scanning the wafer stage 60 in the surface direction of the object 50. A scanning amount of the wafer stage 60 may be an amount that the air bubble BB is removed from the opposite surface of the final lens surface 42 of the projection optical system 40 and the object 50.

The removed air bubble BB may be exhausted to an outer of the liquid supply nozzle 72 or the liquid recovery nozzle 82 as shown in FIG. 3C, or may be recovered the liquid WT' whole the air bubble BB. Even if the removed air bubble BB is exhausted to the outer of the liquid supply nozzle 72 or the liquid recovery nozzle 82 as shown in FIG. 3C, depending on an exposure shot position, the air bubble BB possible to mix between the final lens surface 42 of the projection optical system 40 and the object 50. Therefore, the air bubble BB preferably to be removed from on the object 50 by an air blow, wiping, etc. Although FIG. 3 is showed so that supply of the liquid WT from the liquid supply nozzle 72 and recovery of the liquid WT from the liquid recovery nozzle 82 are stopped, the liquid supply nozzle 72 and the liquid recovery nozzle 82 may supply and recovery the liquid WT respectively.

Next, a description will be given of the remove of the air bubble BB when the air bubble BB is mixed near a middle between the final lens surface 42 of the projection optical system 40 and the object 50 in the liquid WT as shown in FIG. 4A. In this case, the air bubble BB is removable by scanning the wafer stage 60 in the surface direction of the object 50 as shown in FIG. 3B. However, since the flow velocity is almost half of the scanning velocity of the wafer stage 60, a scanning amount of the wafer stage 60 is needed about 2 times as compared with the case that air bubble BB mix in the position near the object 50.

Then, the liquid WT is supplied from the liquid supply nozzle 72, and the liquid WT is recovered from the liquid recovery nozzle 82. Therefore, the flow velocity distribution of the liquid WT between the final lens surface 42 of the projection optical system 40 and the object 50 becomes the maximum flow rate near the middle as shown in FIG. 4B.

If the supply and recovery of the liquid WT are executed continuously, the air bubble BB is recoverable (removable) from the liquid recovery nozzle 82 as shown in FIG. 4C. However, the liquid WT must be a laminar flow to form the flow velocity distribution as shown in FIG. 4B. Therefore, it is necessary to make small a Reynolds number $Re=\rho UD/\mu$ ($\rho$: density, U: representative velocity, D: representative length, $\mu$: viscosity) that is the index. In other words, it is necessary to set the flow velocity of the liquid WT (the supply amount and recovery amount of the liquid WT) according to (the density and viscosity of) the liquid WT and the distance between the final lens surface 42 of the projection optical system 40 and the object 50. For example, if the liquid is pure water and the distance between the final lens surface 42 of the projection optical system 40 and the object 50 is 2 mm, the flow velocity U may be set to the flow velocity U<50 mm/sec that sets the Reynolds number Re to the Reynolds number Re<100. In other words, the flow rate of the liquid WT is adjusted so that the flow velocity U becomes the flow velocity U<50 mm/sec according a form of the liquid supply nozzle 72 and the liquid recovery nozzle 82. The Reynolds number Re can be small by driving the wafer stage 60 in a direction that closes the distance between the final lens surface 42 of the projection optical system 40 and the object 50 not only adjustment of the flow rate of the liquid WT. Moreover, the flow controller 110 may be used.

In addition, a description will be given of the remove the air bubble BB when the air bubble BB is mixed near the final lens surface 42 of the projection optical system 40 in the liquid WT as shown in FIG. 5A. The removing methods of the air bubble BB described refer to FIGS. 3 and 4 is difficult to remove the air bubble BB because the flow velocity of the liquid WT near the final lens surface 42 of the projection optical system 40 is almost 0.

Then, the flow velocity of the liquid WT is adjusted so that the above Reynolds number Re become large, and a turbulent flow is formed in the liquid WT as shown in FIG. 5B. Therefore, the air bubble BB is recoverable (removable) from the liquid recovery nozzle 82 as shown in FIG. 5C. For example, if the liquid WT is pure water and the distance between the final surface 42 of the projection optical system 40 and the object 50 is 2 mm, the flow velocity U may be set to the flow velocity U>1000 mm/sec that sets the Reynolds number Re to the Reynolds number Re>2000. However, the flow velocity is variable within a predetermined range so that a vortex of the turbulent flow does not occur only in the same position, the position of the vortex of the turbulent flow preferably to be moved. The Reynolds number Re can be enlarged by driving the wafer stage 60 in a direction that keeps away the distance between the final lens surface 42 of the projection optical system 40 and the object 50 not only adjustment of the flow rate of the liquid WT. Moreover, the flow controller 110 may be used.

Thus, the exposure apparatus 1 can remove the air bubble BB regardless of the position of the air bubble BB in the liquid WT by the plural removing methods. Moreover, an ultrasonic generator may be installed. The position of the air bubble BB is moved to the object 50 side, the middle between the final lens surface 42 of the projection optical system 40 and the object 50, and the final lens surface 42 of the projection optical system 40 side by the ultrasonic wave, and one of removing method described refer to FIGS. 3 and 5 may be used.

A timing that removes the air bubble BB from the liquid WT preferably to be after carrying the object 50 or immediately after supplying the liquid WT to the space between the final lens surface 42 of the projection optical system 40 and the object 50 for the first time (initially). In other words, after carrying the object 50 and supplying the liquid WT to the space between the final lens surface 42 of the projection optical system 40 and the object 50, an exposure method that removes the air bubble BB mixed in the liquid WT and exposes the object 50 constitute one aspect of the present invention.

Moreover, the controller 100 determines a direction that removes the air bubble BB by the shortest, in other words, the scanning direction of the wafer stage 60 and flow direction of the liquid WT based on the position of the liquid WT in the surface direction of the object 50.

In exposure, light is emitted from the light source part 12, e.g., Koehler-illuminated the reticle 20 via the illumination optical system 14. Light that passes through the reticle 20 and reflects the reticle pattern is imaged onto the object 40 by the projection optical system 40 via the liquid WT. The liquid WT used to the exposure apparatus 1 can remove the air bubble BB mixed in the liquid WT by the removing part, the detector 90 and the controller 100. Thereby, the exposure apparatus 1 can prevent the decrease of the imaging performance by the diffusion of the exposure apparatus due to the air bubble BB, and can expose the pattern of the reticle 20 with very high resolution. Therefore, the exposure apparatus 1 can provide high-quality devices (such as semiconductor devices, LCD devices, photographing devices (such as CCDs, etc.), thin film magnetic heads, and the like) with high throughput and economic efficiency.

Figure 6:
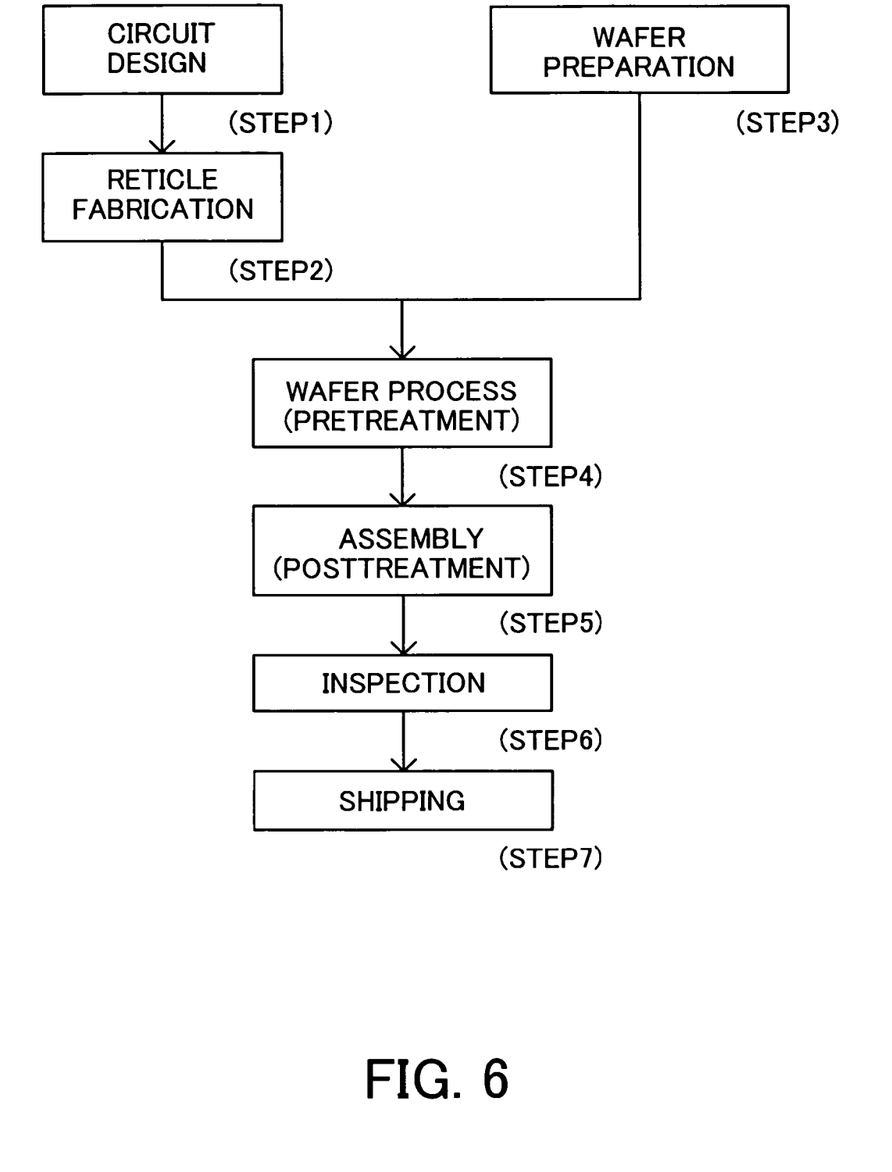
FIG. 6 is a flowchart for explaining how to fabricate devices.
Figure 7:
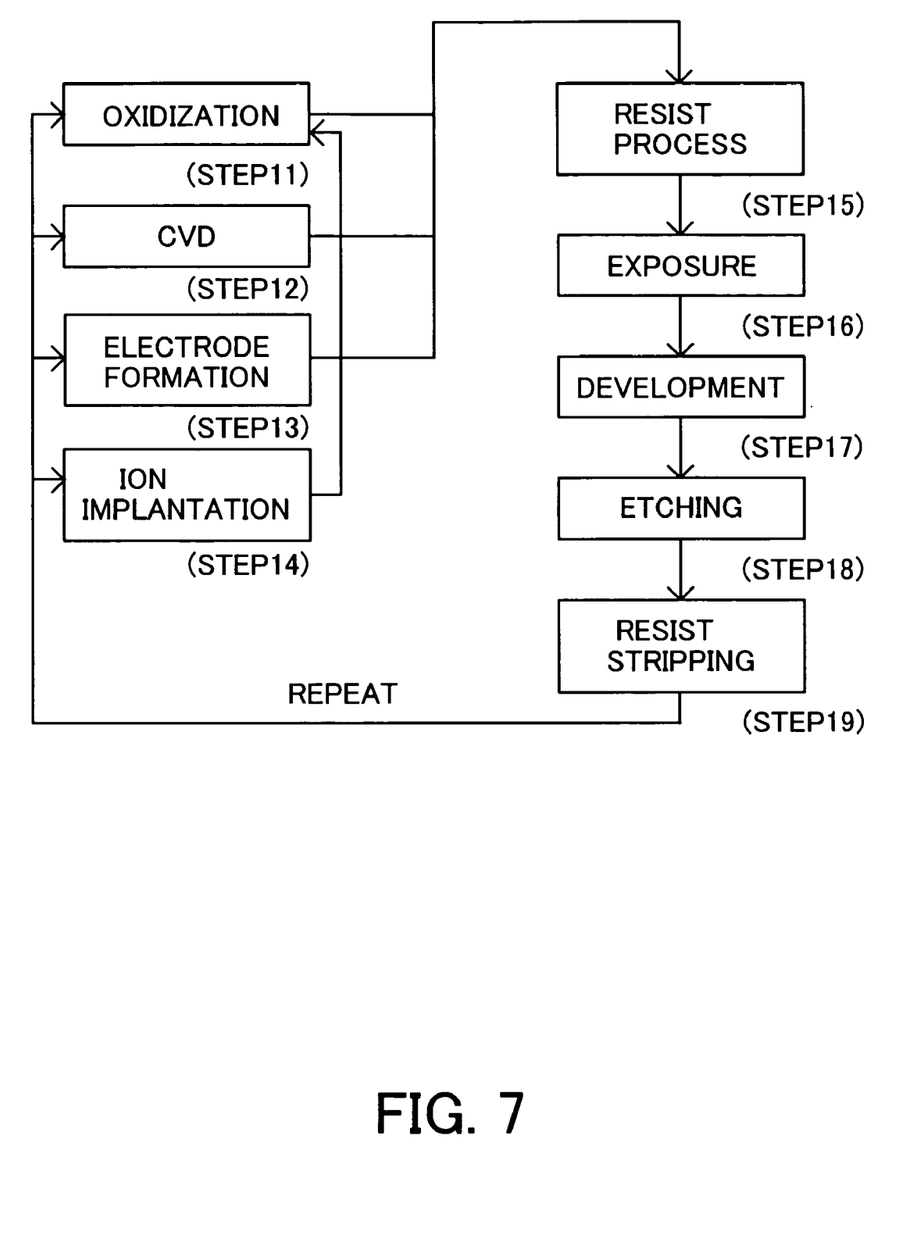
FIG. 7 is a detail flowchart of a wafer process in Step 4 of FIG. 6.

Referring now to FIGS. 6 and 7, a description will be given of an embodiment of a device fabrication method using the above mentioned exposure apparatus 1. FIG. 6 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer prefaration) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Furthermore, the present invention is not limited to these preferred embodiments and various variations and modifications may be made without departing from the scope of the present invention. For example, the present invention is not limited to the removal of the air bubble mixed in the liquid, but can remove the foreign particle (particle) mixed in the liquid similarly.

This application claims a foreign priority benefit based on Japanese Patent Applications No. 2004-303900, filed on Oct. 19, 2004, which is hereby incorporated by reference herein in its entirety as if fully set forth herein.

What is claimed is:

1. An exposure method for exposing a pattern of a reticle onto an object to be exposed supported by a stage, via a projection optical system, said exposure method comprising the steps of:

supplying a liquid to a space between said projection optical system and the object; and removing an air bubble and/or a foreign particle from the liquid supplied at the supplying step, wherein said removing step adjusts an interval between the projection optical system and the object, and flows a laminar flow or a turbulent flow of the liquid to the space between said projection optical system and the object.

2. An exposure method for exposing a pattern of a reticle onto an object to be exposed supported by a stage, via a projection optical system, said exposure method comprising the steps of:

supplying a liquid to a space between said projection optical system and the object; and removing an air bubble and/or a foreign particle from the liquid supplied at the supplying step, wherein said removing step including the steps of:

a first step for scanning the stage in a surface direction of the object;

a second step for adjusting a supplying amount and recovery amount of the liquid within predetermined ranges, and for flowing a laminar of flow the liquid to the space between the projection optical system and the object;

a third step for adjusting a supplying amount and recovery amount of the liquid within predetermined ranges, and for flowing a turbulent flow of the liquid to the space between the projection optical system and the object; and a fourth step for adjusting an interval between the projection optical system and the object, and for flowing a laminar flow or a turbulent flow of the liquid to the space between the projection optical system and the object, and wherein said exposure method further comprises the step of selecting at least one step among the first to forth steps based on positions of the air bubble and/or the contamination in an optical axis direction.

* * * * *